(12) United States Patent
Liu

(10) Patent No.: US 11,061,425 B2
(45) Date of Patent: Jul. 13, 2021

(54) VOLTAGE STABILIZER

(71) Applicant: AdvanOrigin Co., Ltd., Hsinchu (TW)

(72) Inventor: Te-Hua Liu, Hsinchu (TW)

(73) Assignee: AdvanOrigin Co., Ltd., Hsinchu (TW)

( * ) Notice: Subject to any disclaimer, the term of this patent is extended or adjusted under 35 U.S.C. 154(b) by 0 days.

(21) Appl. No.: 16/773,714

(22) Filed: Jan. 27, 2020

(65) Prior Publication Data

US 2021/0080990 A1    Mar. 18, 2021

(30) Foreign Application Priority Data

Sep. 16, 2019  (TW) .................................. 108133179

(51) Int. Cl.
| | |
|---|---|
| *G05F 3/18* | (2006.01) |
| *G05F 3/24* | (2006.01) |
| *H03K 17/687* | (2006.01) |
| *G05F 1/46* | (2006.01) |
| *H03K 17/0812* | (2006.01) |
| *H02M 3/156* | (2006.01) |

(52) U.S. Cl.
CPC .................. *G05F 3/18* (2013.01); *G05F 1/46* (2013.01); *G05F 3/24* (2013.01); *H02M 3/156* (2013.01); *H03K 17/08122* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 6,606,227 B2* | 8/2003 | Rapsinski | ............. | H02J 7/1423 361/86 |
| 6,856,495 B2* | 2/2005 | Ely | ........................ | H02H 7/067 361/18 |
| 7,139,157 B2* | 11/2006 | Taylor | .................... | H02H 3/202 361/84 |

* cited by examiner

*Primary Examiner* — Jeffery S Zweizig
(74) *Attorney, Agent, or Firm* — Hamre, Schumann, Mueller & Larson, P.C.

(57) ABSTRACT

A voltage stabilizer receives a direct-current (DC) input voltage, and includes four resistors, two transistors, and a diode that cooperatively provide a stable DC output voltage. The voltage stabilizer is configured such that the diode does not directly receive the DC input voltage and does not conduct all the time, so as to reduce power consumption.

8 Claims, 2 Drawing Sheets

VOLTAGE STABILIZER

CROSS-REFERENCE TO RELATED APPLICATION

This application claims priority of Taiwanese Invention Patent Application No. 108133179, filed on Sep. 16, 2019.

FIELD

The disclosure relates to a voltage stabilizer.

BACKGROUND

A conventional voltage stabilizer includes a Zener diode which is directly coupled to a terminal provided with a high voltage, and which continuously stays in a conducting state. Such a configuration may result in continuous heating and power consumption of the voltage stabilizer, which has room for improvement.

SUMMARY

Therefore, an object of the disclosure is to provide a voltage stabilizer that can alleviate at least one of the drawbacks of the prior art in terms of heating and power consumption.

According to the disclosure, the voltage stabilizer includes first to fourth resistors, first and second transistors, and a diode. The first resistor has a first terminal disposed to receive a direct-current (DC) input voltage, and a second terminal. The second resistor is coupled between the second terminal of the first resistor and ground. The first transistor has a first terminal coupled to the second terminal of the first resistor, a grounded second terminal, and a control terminal. The third resistor is coupled between the control terminal of the first transistor and ground. The fourth resistor has a first terminal coupled to the first terminal of the first resistor, and a second terminal. The second transistor has a first terminal coupled to the second terminal of the fourth resistor, a second terminal disposed to provide a DC output voltage, and a control terminal coupled to the second terminal of the first resistor. The first diode has an anode coupled to the control terminal of the first transistor, and a cathode coupled to the second terminal of the second transistor.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
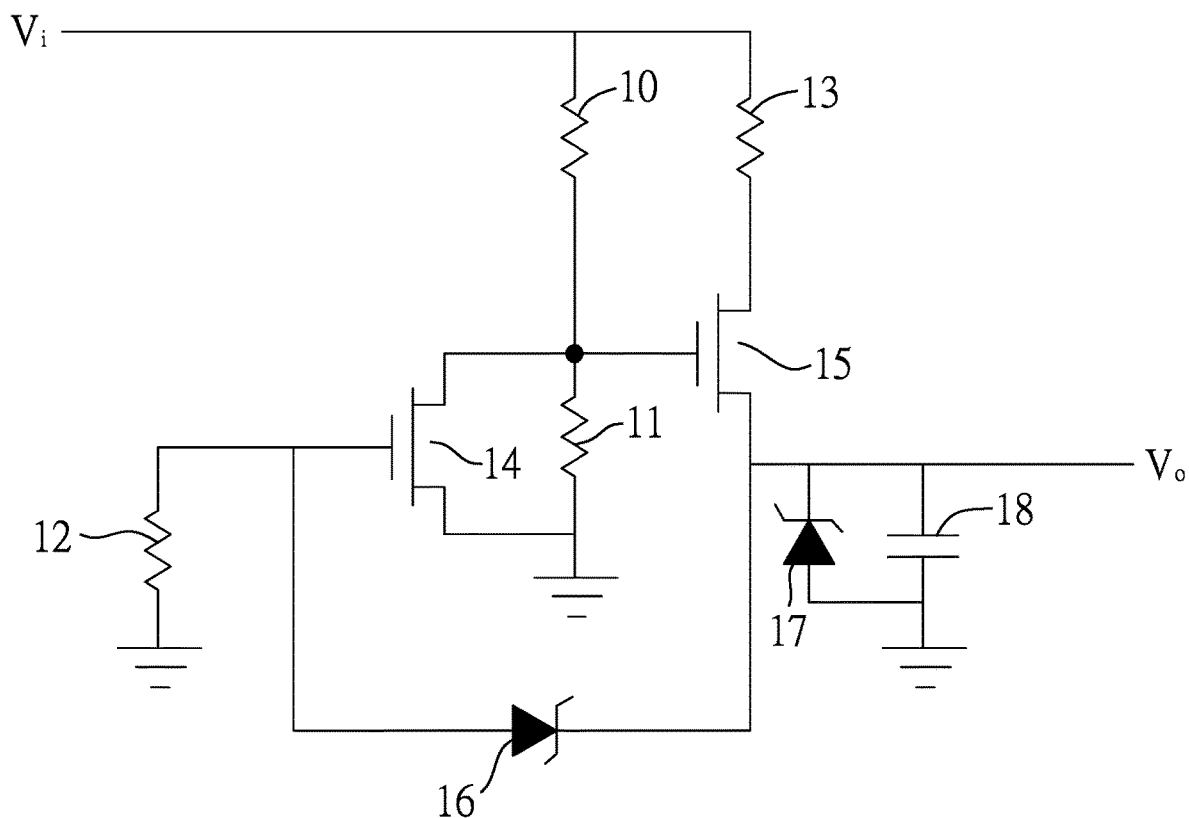
FIG. 1 is a schematic circuit diagram illustrating a first embodiment of a voltage stabilizer according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a voltage stabilizer according to this disclosure is shown to include first to fourth resistors 10-13, first and second transistors 14, 15, first and second diodes 16, 17, and a capacitor 18.

The first resistor 10 has a first terminal disposed to receive a high direct-current (DC) input voltage $V_i$, and a second terminal. In this embodiment, the DC input voltage $V_i$ ranges, for example, from 100V to 240V.

The second resistor 11 is coupled between the second terminal of the first resistor 10 and ground.

The first transistor 14 has a first terminal coupled to the second terminal of the first resistor 10, a grounded second terminal, and a control terminal.

The third resistor 12 is coupled between the control terminal of the first transistor 14 and ground.

The fourth resistor 13 has a first terminal coupled to the first terminal of the first resistor 10, and a second terminal.

The second transistor 15 has a first terminal coupled to the second terminal of the fourth resistor 13, a second terminal disposed to provide a DC output voltage $V_o$, and a control terminal coupled to the second terminal of the first resistor 10.

The first diode 16 has an anode coupled to the control terminal of the first transistor 14, and a cathode coupled to the second terminal of the second transistor 15.

The second diode 17 has a grounded anode, and a cathode coupled to the second terminal of the second transistor 15.

The capacitor 18 is coupled between the second terminal of the second transistor 15 and ground.

In this embodiment, each of the first and second diodes 16, 17 is a Zener diode, and each of the first and second transistors 14, 15 is an N-type metal-oxide-semiconductor field-effect transistor (MOSFET), which has a drain terminal serving as the first terminal of the first or second transistor 14, 15, a source terminal serving as the second terminal of the first or second transistor 14, 15, and a gate terminal serving as the control terminal of the first or second transistor 14, 15.

In operation, when the DC output voltage $V_o$ is smaller than a Zener voltage of the first diode 16, the first diode 16 does not conduct, making the first transistor 14 not conduct and the second transistor 15 conduct, so the capacitor 18 is charged with the DC output voltage $V_o$. When the DC output voltage $V_o$ is greater than the Zener voltage of the first diode 16, the first diode 16 conducts, making the first transistor 14 conduct and the second transistor 15 not conduct, so a voltage across the capacitor 18 serves as the DC output voltage $V_o$. In addition, the second diode 17 is used to guide an excessive current to ground, wherein the excessive current may result from an instantaneous high voltage that occurs when the second transistor 15 switches to conducting, thereby preventing the first transistor 14 from burning out. In this embodiment, the second diode 17 has a Zener voltage greater than the DC output voltage $V_o$, so the second diode 17 is normally non-conducting and does not consume power.

Figure 2:
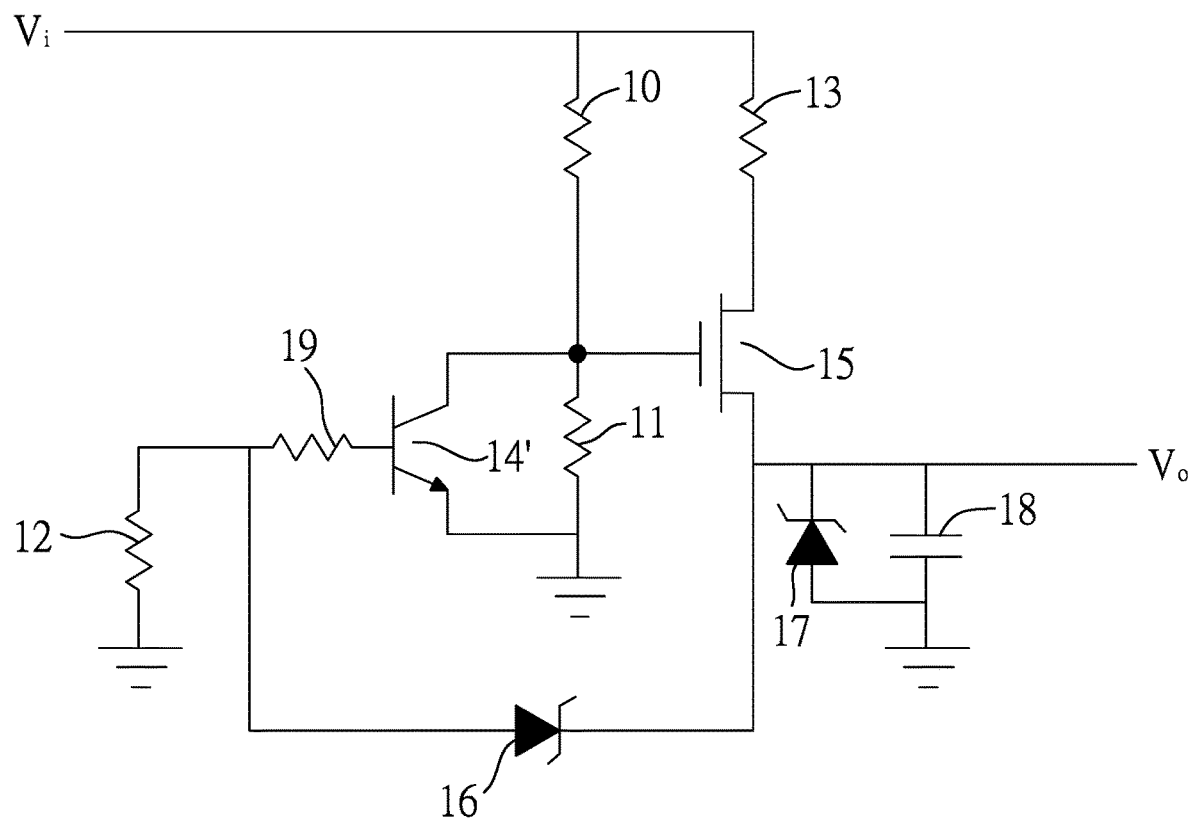
FIG. 2 is a schematic circuit diagram illustrating a second embodiment of a voltage stabilizer according to the disclosure.

Referring to FIG. 2, a second embodiment of a voltage stabilizer according to this disclosure is shown to be similar to the first embodiment, and differs in that, in the second embodiment, the first transistor 14, which is an N-type MOSFET in the first embodiment, is replaced by a first transistor 14', which is an NPN-type bipolar junction transistor (BJT) that has a collector terminal serving as the first terminal of the first transistor 14', an emitter terminal serving as the second terminal of the first transistor 14', and a base terminal serving as the control terminal of the first transistor 14'. In addition, the second embodiment further includes a current-limiting resistor 19 having a first terminal coupled to the control terminal of the first transistor 14', and a second terminal coupled to the third resistor 12 and the anode of the first diode 16. Operation of the second embodiment is similar to that of the first embodiment, so details thereof are omitted herein for the sake of brevity.

In summary, the first and second diodes 16, 17 in the embodiments according to this disclosure do not directly receive the DC input voltage $V_i$, and would not be conducting at all times. Furthermore, the Zener voltage of the second diode 17 is configured to be greater than the DC output voltage $V_o$ in order to make the second diode 17 hardly consume any power. By virtue of the abovementioned configuration, the voltage stabilizer according to this disclosure can reduce the heat generation and power consumption in comparison to the conventional voltage stabilizer while having a low-cost, simple circuit structure.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A voltage stabilizer, comprising:
   a first resistor having a first terminal disposed to receive a direct-current (DC) input voltage, and a second terminal;
   a second resistor coupled between said second terminal of said first resistor and ground;
   a first transistor having a first terminal coupled to said second terminal of said first resistor, a grounded second terminal, and a control terminal;
   a third resistor coupled between said control terminal of said first transistor and ground;
   a fourth resistor having a first terminal coupled to said first terminal of said first resistor, and a second terminal;
   a second transistor having a first terminal coupled to said second terminal of said fourth resistor, a second terminal disposed to provide a DC output voltage, and a control terminal coupled to said second terminal of said first resistor; and
   a first diode having an anode coupled to said control terminal of said first transistor, and a cathode coupled to said second terminal of said second transistor.

2. The voltage stabilizer of claim 1, wherein said first diode is a Zener diode.

3. The voltage stabilizer of claim 1, further comprising a second diode having a grounded anode, and a cathode coupled to said second terminal of said second transistor.

4. The voltage stabilizer of claim 3, further comprising a capacitor coupled between said second terminal of said second transistor and ground.

5. The voltage stabilizer of claim 3, wherein each of said first and second diodes is a Zener diode.

6. The voltage stabilizer of claim 5, wherein said second diode has a Zener voltage greater than the DC output voltage.

7. The voltage stabilizer of claim 1, wherein each of said first and second transistors is an N-type metal-oxide-semiconductor field-effect transistor.

8. The voltage stabilizer of claim 1, wherein said first transistor is an NPN-type bipolar junction transistor, said second transistor is an N-type metal-oxide-semiconductor field-effect transistor, and said voltage stabilizer further comprises:
   a current-limiting resistor having a first terminal coupled to said control terminal of said first transistor, and a second terminal coupled to said third resistor and said anode of said first diode.

* * * * *